United States Patent [19]

Roeser, Jr.

[11] Patent Number: 4,741,784

[45] Date of Patent: May 3, 1988

[54] COMPOSITION AND METHOD FOR REMOVING CONFORMAL COATINGS

[75] Inventor: Howard L. Roeser, Jr., Mission Viejo, Calif.

[73] Assignee: Kote-Off, Inc., El Toro, Calif.

[21] Appl. No.: 893,322

[22] PCT Filed: Nov. 22, 1985

[86] PCT No.: PCT/US85/02339

§ 371 Date: Jul. 25, 1986

§ 102(e) Date: Jul. 25, 1986

[87] PCT Pub. No.: WO86/03145

PCT Pub. Date: Jun. 5, 1986

Related U.S. Application Data

[63] Continuation-in-part of Ser. No. 674,562, Nov. 26, 1984, abandoned.

[51] Int. Cl.$^4$ .................... B08B 7/00; C11D 7/50; C11D 7/52; C23D 17/00
[52] U.S. Cl. .................................. 134/38; 134/42; 252/90; 252/170; 252/171; 252/364; 252/DIG. 8
[58] Field of Search .................. 134/38, 42; 252/170, 252/171, 364, DIG. 8, 90

[56] References Cited

U.S. PATENT DOCUMENTS

| | | | |
|---|---|---|---|
| 3,094,491 | 6/1963 | Greminger et al. | 252/171 |
| 3,625,763 | 12/1971 | Melillo | 134/38 |
| 3,650,969 | 3/1972 | Baltakmens et al. | 252/143 |
| 3,661,641 | 7/1972 | Vigh et al. | 134/6 |
| 3,706,691 | 12/1972 | Duffy et al. | 252/364 |
| 3,856,695 | 12/1974 | Geiss et al. | 252/162 |
| 3,988,256 | 10/1976 | Vandermey et al. | 252/171 |
| 4,220,549 | 9/1980 | Moore et al. | 252/171 |
| 4,269,724 | 5/1981 | Hodson | 252/171 |

*Primary Examiner*—Dennis Albrecht
*Attorney, Agent, or Firm*—Knobbe, Martens, Olson & Bear

[57] ABSTRACT

A composition and method for removing conforming coatings such as polyurethane or epoxy from printed circuit boards is disclosed. The composition comprises separate base and activator components which are mixed to form the coating remover. The base component comprises methylene chloride or toluene, or a mixture thereof, preferably together with a thickening agent. In general, the activator component comprises (a) from about 75 to about 85 parts methylene chloride or toluene, or a mixture thereof, (b) about 7 to about 25 parts lower alkyl alcohol, and (c) about 2 to about 8 parts acetone or methylethylketone. For epoxy conformal coatings, the activator component preferably comprises 85 parts of (a): about 7 to about 15 parts of (b); and about 2 to about 6 parts of (c). The activator component for removing polyurethane conformal coatings preferably comprises 75 parts of (a), about 15 to about 25 parts of (b); about 2 to about 8 parts of (c). The base component is usually mixed with the activator component in a ratio of from 1:1 to 10:1, depending on the thickness of the coating to be removed. The composition is used by combining the base component with the activator component, treating a conformal coating on a printed circuit board by applying the coating remover thereto, and removing the treated conformal coating. Ultraviolet light accelerates the reaction between the conformal coating and the composition of the present invention.

21 Claims, No Drawings

COMPOSITION AND METHOD FOR REMOVING CONFORMAL COATINGS

This application is a continuation-in-part of application Ser. No. 674,562 filed Nov. 26, 1984, which is now abandoned.

BACKGROUND OF THE INVENTION

This invention relates to removal of conformal coatings from printed circuit boards, and, in particular, to a composition and method for removing polyurethane and epoxy coatings from printed circuit boards to permit and facilitate repair thereof.

A conformal coating, as that term is used herein, is a coating applied to a printed circuit board to protect the components and circuitry from moisture and contaminants, and, to some degree, from mechanical shock, vibration, shorting, and tampering. Although a large number of coating compositions have been used as conformal coatings, polyurethane and epoxy coatings are the most common. When properly applied, the conformal coating effectively surrounds the entire printed circuit board and the components thereon.

Typical printed circuit boards are formed of woven glass fibers impregnated with an epoxy resin and having etched or printed metal cladding on one or both sides defining electrical circuits. Holes are drilled in the circuit board to receive components, which are soldered into place and into electrical contact with the conductive metal circuits on the board.

Conformal coatings are becoming increasingly popular in consumer and business electronics products. However, their principal use is in applications in which the printed circuit board is likely to be subjected to moisture, shock, and abuse.

In order to effectively fulfill their function, conformal coatings must be impervious to water and most common solvents and not susceptible to ready removal. These properties, although desirable from the standpoint of protection of the circuit board and components, create significant problems in effecting repair of circuit boards containing defective components. This problem is discussed at length in U.S. Pat. No. 4,451,523 to Native, et al. Epoxy resins have been virtually impossible to remove chemically because any solvent that would remove the epoxy coating would, as a general rule, also damage the epoxy-resin impregnated circuit board and the potted electronic components on the circuit board.

The thickness of conformal coatings may vary from application to application. A conformal coating remover that can satisfactorily remove a 10 mil conformal coating may damage the board when used to remove a 2 mil conformal coating. The prior art has provided no effective solution to this problem.

As a result, repair of boards with epoxy conformal coatings has been a time-consuming and labor-intensive process. The only satisfactory method, to date, for repairing such coated boards is to physically abrade or scrape the coating off of the soldered junctions to permit desoldering and removal of defective components. The scraping or abrading processes for mechanically removing the conformal coating carry with them the possibility of damaging the components or the circuits on the board. If a circuit is cut, the board must be discarded.

Polyurethane coatings are also insoluble in most common solvents. Corrosive strippers which can remove the cured polyurethane coating will, as a general rule, also corrode metallic surfaces on the board. Thus, polyurethane coatings, like epoxy coatings, are typically removed by mechanical processes such as scraping and abrading to permit rework of the board.

There have been great advances in recent years in automated in-circuit testing equipment for printed circuit boards. Such automated testing machines can analyze and test in the neighborhood of 250 boards per hour. However, because of the dielectric properties of conformal coatings, these machines cannot be used on coated boards without first removing the conformal coating. Ironically, this step is still performed by hand, one board at a time.

Accordingly, there is a significant need for compositions which can satisfactorily remove epoxy and polyurethane conformal coatings without damaging the printed circuit board or the components thereon. One attempt to provide a conformal coating solvent mixture is described in U.S. Pat. No. 4,383,867 to Elwell. This patent discloses a mixture of 70% dichloromethane, 20% dimethyl formamide, and 10% methanol that is said to be useful in removing polyurethane conformal coatings from printed circuit boards. This single-part composition merely softens the polyurethane coating, which must still be scraped off. Unfortunately, it also softens the underlying resin-impregnated board. In addition, this composition is not suitable for use on epoxy-coated boards.

Another single-part composition for removing conformal coatings is disclosed in U.S. Pat. No. 3,625,763, to Melillo. This composition is said to loosen the resin in a few minutes, with complete removal occurring over a two-hour period. Two hours, of course, is much too long for practical utility. A practical conformal coating remover will remove conformal coating in 10 minutes or less, preferably in five minutes or less.

Accordingly, it is an object of the present invention to provide a composition and method for effectively removing cured epoxy and polyurethane conformal coatings from printed circuit boards.

BRIEF DESCRIPTION OF THE INVENTION

According to the invention, there is provided a material for removing conformal coating from a printed circuit board, comprising a base component and an activator component in separate containers, said base component and said activator component forming an active conformal coating remover when mixed, wherein:

said base component comprises methylene chloride or toluene or a mixture thereof; and said activator component comprises (a) about 75 to 85 parts by volume methylene chloride or toluene, or a mixture thereof, (b) about 7 to about 25 parts by volume lower alkyl alcohol, and (c) about 2 to about 8 parts by volume acetone or methylethylketone.

In a preferred embodiment of the present invention, there is provided a composition for removing a conformal coating from a printed circuit board, preferably an epoxy conformal coating, comprising a base component of methylene chloride or toluene or a mixture thereof, and an activator component comprising (a) 85 parts by volume methylene chloride or toluene or a mixture thereof, (b) 7 to 15 by parts by volume lower alkyl alcohol, and (c) 2 to 6 parts by volume acetone or methylethylketone. The preferred composition for epoxy conformal coating removal has a base component comprising methylene chloride and an activator component comprising (a) 85 parts by volume methylene chloride, (b) about 9 to about 13 parts by volume, and preferably about 11 parts by volume lower alkyl alcohol, and (c) 3 to 5 parts by volume, and preferably about 4 parts by volume acetone.

In accordance with another preferred embodiment of the present invention, there is disclosed a composition for removing a conformal coating from a printed circuit board, preferably a polyurethane conformal coating, having a base component comprising methylene chloride or toluene or a mixture thereof, and an activator component comprising (a) 75 parts by volume methylene chloride or toluene or a mixture thereof, (b) 15 to 25 parts by volume lower alkyl alcohol, and (c) 2 to 8 parts by volume acetone or methylethylketone. In a preferred embodiment, the base component comprises methylene chloride and the activator component comprises (a) 75 parts by volume methylene chloride, (b) about 18 to about 22 parts by volume, and preferably about 20 parts by volume lower alkyl alcohol, and (c) about 4 to about 6 parts by volume, and preferably about 5 parts by volume acetone.

Preferably the base component in the compositions of this invention include a thickener. The preferred thickeners are pectin, cellulose thickeners, and silica thickeners.

These two-part systems for removing conformal coating from printed circuit boards provide significant advantages over the one-part systems heretofore used. These advantages include the ability to tailor-mix the base and activator components to remove any particular desired thickness of conformal coating, as well as an apparent increase in stability under normal working conditions when the base and activator components remain separated. Accordingly, the present invention contemplates a conformal coating removal system, comprising a base component and an activator component in separate containers for mixing in a desired ratio.

In accordance with yet another aspect of the present invention, a method for removing conformal coatings, preferably epoxy or polyurethane, from a printed circuit board is disclosed, comprising the steps of forming an active coating remover composition by combining the base component and the activator component of one of the coating remover compositions disclosed above, treating a conformal coating on a printed circuit board by applying the active coating remover thereto, and removing the treated conformal coating.

Thus, one embodiment of this invention provides a method for removing a polyurethane or epoxy conformal coating from a printed circuit board, comprising the steps of:

obtaining the base component and the activator component of the conformal coating remover system described above;

selecting a ratio of base component to activator component in the range of about 1:1 to about 10:1 by volume, wherein the selection of the ratio is based on the thickness of the conformal coating to be removed;

forming an active conformal coating remover composition by combining the base component and said activator component in the selected ratio;

treating a conformal coating on a printed circuit board by applying the active coating remover thereto; and removing the treated conformal coating.

The action of the active coating remover may be accelerated and improved by exposing the treated conformal coating to an ultraviolet light source. Between about 1 and 15 minutes after treatment, and preferably after about 5 minutes, the treated conformal coating can be loosened by scrubbing and removed by rinsing with water. The ultraviolet light preferably has a wavelength of 180-235 nm. An intensity of 110 microwatts per square centimeter of board is particularly preferred. When the light is spaced one meter from the work, the conformal coating may be removed in as little as one minute.

The present invention also includes a method for removing conformal coatings of various thickness, by varying the ratio of base component to activator component. Thus, in most instances, a 6 mil coating may be removed by applying a mixture of four parts base component with one part activator component. This ratio is increased for thinner coatings and decreased for thicker coatings.

DETAILED DESCRIPTION OF THE PREFERRED EMBODIMENTS

Unlike prior art compositions, the composition of the present invention is a system, preferably two-part, that rapidly removes epoxy and/or polyurethane conformal coating without damaging the printed circuit board itself. The composition can be rinsed off of the board with water, together with the treated conformal coating.

The first component, or base component, of the present composition comprises methylene chloride, toluene, or mixtures thereof. The base component also preferably includes a thickening agent. The purpose of the thickening agent is to increase the viscosity of the composition, so that localized application of the conformal coating remover composition is possible. Localized application is not only more economical, it also prevents contact between the remover and electronic components that could be damaged thereby. The particular thickening agent used is not critical, so long as the thickener is compatible with the other ingredients of the composition. A large number of conventional thickeners are known. Such thickeners include starches, gums, casein, gelatin, phycocolloids, semi-synthetic cellulose derivatives (such as carboxymethyl cellulose, cellulose acetate butyrate, cellulose acetate propionate, cellulosic acid, and modified cellulose), pectin, carrageenan, polyvinyl alcohol, carboxy-vinylates, bentonite, silicates, and colloidal silica. Of course, the properties of the various thickeners and their relative advantages and disadvantages are well known to those of ordinary skill in the art. Those thickeners that also have emulsifying and suspending properties are particularly valuable because they facilitate water removal of the composition. Preferred thickening agents are pectin, cellulose acetate butyrate, colloidal silica such as that sold by Cabot Corporation under the trademark "Cab-O-Sil", and vinyl polymers such as those sold by B. F. Goodrich Company under the trademark "Carbopol".

The amount of thickener in the base component is not critical, and obviously depends to a large extent on the particular thickener used. The optimum amount of any particular thickener can be readily determined by a person of ordinary skill in the art. Of course, the amount of thickener is also dependent on the manner in which the coating remover is to be applied to the boards; e.g., by squirting, brushing, or dipping, and is also dependent on the orientation of the board (vertical or horizontal). For most applications, the thickener will comprise between 2 and 16 percent (by volume) of the base composition, and usually about 8 percent by volume. The preferred consistency is a soft gel that will not run when applied to the board in modest quantities.

There are three essential ingredients in the activator component of the present composition. If desired, the activator component may consist exclusively of these ingredients. The first ingredient is methylene chloride or toluene. Methylene chloride is preferred.

The second ingredient of the activator component is a lower alkyl alcohol. As used herein, the term "lower alkyl alcohol" means alcohols containing from 1 to about 5 carbon atoms, such as methanol, ethanol, the propanols, the butanols, and the pentanols, and also diacetone alcohol. Methanol, ethanol, propanol, and butanol are preferred.

The third ingredient of the activator component is acetone or methylethylketone. Acetone is preferred.

In general, the activator component comprises (a) from about 75 to about 85 parts by volume methylene chloride or toluene, or a mixture thereof, (b) about 7 to about 25 parts by volume lower alkyl alcohol, and (c) about 2 to about 8 parts by volume acetone or methylethylketone.

The composition of the activator component is varied depending on whether an epoxy or a polyurethane coating is to be removed, as described below.

The activator component for removing epoxy conformal coatings comprises 85 parts by volume of methylene chloride or toluene (or a mixture thereof), about 7 to 15 parts by volume of a lower alkyl alcohol, and about 2 to about 6 parts by volume acetone or methylethylketone (or a mixture thereof). The preferred composition contains from about 9 to about 13 parts, and preferably about 11 parts by volume lower alkyl alcohol, and from about 3 to about 5 parts acetone or methylethylketone, preferably about 4 parts by volume.

The activator component for use on polyurethane coatings contains 75 parts by volume of methylene chloride or toluene, 15 to 25 parts by volume of a lower alkyl alcohol, and 2 to 8 parts by volume of acetone or methylethylketone. The preferred composition contains from about 18 to about 22 parts, and preferably about 20 parts lower alkyl alcohol, and from about 4 to about 6, and preferably about 5 parts acetone or methylethylketone.

Compositions within these ranges, and particularly within the preferred ranges, exhibit markedly superior properties in comparison to compositions outside those ranges. Although the effects of the various components are interrelated, the amount of alcohol appears to be particularly important.

The composition is used to remove conformal coatings having roughly an 8 mil thickness by combining 75 parts base component with from about 18 to about 32 parts activator component, preferably in a ratio of about 3 to 1. This forms an active coating remover composition. The activity of the coating remover is time-dependent, and the most satisfactory results are achieved by using the active coating remover within about 2 or 3 days after formulation.

The present invention may be used to remove conformal coatings of varying thicknesses by varying the ratio of base component to activator component. By varying this ratio, the activity of the conformal coating remover can be altered. In this way, the user may formulate an active conformal coating remover composition that will effectively remove the conformal coating without harming the board. In other words, the removal of a specified thickness of conformal coating exhausts the properly-compounded active conformal coating composition so that no damage to the board occurs.

The ratio of base component to activator component may vary from about 1:1 to 10:1, and preferably from about 2:1 to 6:1. Thus, for a 10 mil coating, an effective active conformal coating remover composition is made by combining the base and activator components in the ratio of 2:1. For an 8 mil conformal coating, the ratio is preferably 3:1; for a 6 mil coating, the ratio is 4:1; for a 4 mil coating, the ratio is 5:1, and for a 2 mil coating, the ratio that is preferred is about 6:1.

The ideal ratio of base component to activator component for any particular coating can be readily determined by testing various ratios of base component to activator component on an innocuous part of the coated board. The ratio of 3:1 will ordinarily be used as a starting point.

The active coating remover is applied to the printed circuit board by any suitable method, such as by dipping one or both sides of the circuit board into the composition, squirting the composition onto the circuit board, or painting the composition on the desired area. For spot removal of the conformal coating, the best method is to squirt a small amount of the composition onto the coating to be removed. A conventional squeeze bottle has proved satisfactory for this purpose. Many electronic components on printed circuit boards are encapsulated in epoxy, polyurethane, or other polymer material, so, in order to avoid damage to these components, it is best to avoid applying the remover directly to the components.

When automatic board testing equipment is to be used, it is generally preferable to remove the conformal coating from the entire back side of the board. Manual or automated techniques for rolling, brushing, or spraying the composition onto the board may be used.

After the activated composition has been applied to the coating, it rapidly reacts with the coating. The particular compositions of the present invention exhibit very precise depth and duration properties. They have been formulated to rapidly remove the outer conformal coating layer, yet become inactive as the coating layer is penetrated and the composition contacts the resin of the printed circuit board.

The speed with which the composition removes the coating can be significantly accelerated by exposing the treated board to light, preferably ultraviolet light. Although an ultraviolet light source of 100 watts at 1 meter is particularly effective, good results are also seen with ordinary incandescent light. The intensity of the ultraviolet light and the wavelength of the ultraviolet light have significant effects. The preferred wavelength corresponds to short-wavelength ultraviolet, in the range of 180–235 nm. A 500 watt ultraviolet light is notably more effective than a 100 watt ultraviolet light, permitting removal of the conformal coating in one minute or less.

After the composition has worked on the conformal coating for an appropriate period of time, generally between about 1 minute and about 15 minutes, and preferably about 5 minutes, the treated coating is scrubbed to loosen it and is then rinsed off with ordinary tap water.

The method of the present invention effectively and completely removes the conformal coating from the treated area of the board. Usually a thin layer of the outer "gel coat" of the board itself is also removed; however, this gel coat is only cosmetic, and the etching, as it were, does not extend into the fibers of the board or in any way weaken or damage the board. In contrast, ordinary solvents tend to simultaneously soften both the conformal coating and the resin comprising the board itself, so that when the coating is effectively removed, the board is softened and damaged.

EXAMPLE 1

An epoxy conformal coating remover is formulated as follows:
Base Component:
92% by volume methylene chloride
8% by volume cellulose acetate butyrate
Activator Component:
85% by volume methylene chloride
11% by volume ethanol
4% by volume acetone Three parts by volume of base component were combined with one part by volume activator component, and the composition was mixed by shaking. The resulting active coating remover composition was applied to an epoxy conformal coating on a printed circuit board with a squirt bottle and the treated area was exposed to sunlight for 4 minutes. The conformal coating was then loosened with a stiff brush, and the board was rinsed with water. The treated area was smooth and clean and showed no traces of conformal coating. Although the surface pattern of the fibers in the board was visible in the treated area, the fibers were not exposed and the resin impregnating the fibers was not softened or otherwise damaged. Electronic components were easily removed from the treated area by desoldering.

EXAMPLE 2

A polyurethane conformal coating remover was formulated as follows:
Base Component:
92% by volume methylene chloride
8% by volume cellulose acetate butyrate
Activator Component:
75% by volume methylene chloride
20% by volume methanol
5% by volume acetone Three parts by volume of base component were combined with one part by volume activator component, and the composition was mixed by shaking. The resulting active coating remover composition was applied to a polyurethane conformal coating on a printed circuit board with a squirt bottle and the treated area was exposed to sunlight for 4 minutes. The conformal coating was then loosened with a stiff brush, and the board was rinsed with water. The treated area was smooth and clean and showed no traces of conformal coating. Although the surface pattern of the fibers in the board was visible in the treated area, the fibers were not exposed and the resin impregnating the fibers was not softened or otherwise damaged. Electronic components were easily removed from the treated area by desoldering.

EXAMPLE 3

The conformal coating remover composition of U.S. Pat. No. 4,383,867 was formulated by combining 70 volume percent methylene chloride, 20 volume percent dimethyl formamide, and 10 volume percent methanol. A printed circuit board was immersed in the composition as instructed in the patent. The treated conformal coating was checked at approximately five minute intervals to determine whether the polyurethane conformal coating had been sufficiently softened to permit removal thereof. After about 20 minutes, the conformal coating could be removed by scraping. The resin of the underlying board was softened and damaged by the composition. The paint had been removed from the resistors, and many of the potted electronic components had been damaged. The insulating varnish on the copper wire in inductors on the board had been removed.

EXAMPLE 4

The composition of Example 3 was thickened with cellulose acetate butyrate until it was approximately the same consistency as the active compositions of Examples 1 and 2. A printed circuit board having the same polyurethane conformal coating as the board in Example 2 was treated by squirting the thickened composition onto a small area on the back of the board. The treated board was exposed to sunlight with no apparent effect. The treated area was periodically tested to ascertain whether the conformal coating could be removed. After approximately 30 minutes, the coating had been sufficiently softened to permit removal by scraping. The underlying board had also been softened and damaged. The scraping procedure removed not only conformal coating, but also part of the resin impregnating the glass fibers of the board.

From the foregoing examples, it is apparent that the novel two-part composition of the present invention provides significantly superior results over the composition of U.S. Pat. No. 4,383,867, and permits ready removal of conformal coating without damage to the printed circuit board.

EXAMPLE 5

In order to demonstrate the effect of the two-part composition on the effectiveness of the active conformal coating remover, base component and activator component for epoxy conformal coating were prepared. The base component and activator component were maintained in separate closed metal containers. Some of the base component and activator component was used to formulate active conformal coating remover composition by combining the components in the volume ratio of 3:1. This active composition was also placed in a closed container.

The three containers, respectively containing base component, activator component, and active (mixed base and activator) conformal coating remover, were stored for a period of several weeks in a storage building where the temperature ranged from about 55° F. to about 90° F. Additional active conformal coating remover composition was then prepared from the base and activator components, and this fresh conformal coating remover was compared to the previously-mixed conformal coating remover. The fresh conformal coating remover effectively removed an epoxy conformal coating from a printed circuit board in under five minutes. The old conformal coating composition, on the other hand, required more than 15 minutes to act, and removal of the conformal coating was not complete.

The explanation for this loss of activity is not known. Under controlled laboratory conditions, when the experiment was repeated in carefully-sealed laboratory containers maintained in a temperature-controlled environment, the loss of activity noted above in the previously-mixed composition did not occur.

The ordinary commercial user of conformal coating removers, of course, is unable or unwilling to exercise the care necessary to store conformal coating compositions under laboratory conditions and under controlled temperatures. Under such circumstances, a two-part composition would appear to reduce the chances of accidental inactivation of the conformal coating remover.

EXAMPLE 6

The effect of the ratio of base component to activator component and the relationship of that ratio to coating thickness is studied by varying the ratio on a volume basis to ascertain the optimum ratio for a given coating thickness.

Various conformal coating remover compositions having ratios of base component to activator component from 2:1 to 6:1 are applied to a printed circuit board having a 6 mil epoxy coating. The conformal coating remover composition having the best characteristics for removing this 6 mil coating has a ratio of base component to activator component of 4:1. Similar results are achieved with a polyurethane conformal coating.

EXAMPLE 7

The test of Example 6 is repeated on four other printed circuit boards having epoxy conformal coating thicknesses of 2 mils, 4 mils, 8 mils, and 10 mils. It is determined that the best volume ratio for a 2 mil coating is 6:1; the best volume ratio for a 4 mil coating is 5:1; the best volume ratio for an 8 mil coating is 3:1; and the best volume ratio for a 10 mil coating is 2:1.

EXAMPLE 8

A conformal coating remover composition is prepared having a volume ratio of base component to activator component of 3:1. This composition is applied to a printed circuit board having an 8 mil epoxy coating. After approximately five minutes at 70° C., the coating has been loosened and may be removed with water. The same composition is then applied to another part of the same board. The board is then exposed to a 500 watt short-wave ultraviolet light at a distance of one meter. The conformal coating may be removed after approximately 45 seconds.

This demonstrates the acceleration of the chemical reactions involved in the conformal removing system of the present invention when exposed to ultraviolet light.

What is claimed is:

1. A system for removing conformal coating from a printed circuit board, comprising a base component and an activator component in separate containers, said base component and said activator component forming an active conformal coating remover when mixed, wherein:
   said base component comprises methylene chloride or toluene or a mixture thereof; and
   said activator component comprises (a) about 75 to about 85 parts by volume methylene chloride or toluene, or a mixture thereof, (b) about 7 to about 25 parts by volume lower alkyl alcohol, and (c) about 2 to about 8 parts by volume acetone or methylethylketone.

2. The system of claim 1 for removing an epoxy coating, wherein:
   said activator component comprises (a) 75 parts by volume methylene chloride or toluene, or a mixture thereof, (b) about 15 to about 25 parts by volume lower alkyl alcohol, and (c) about 2 to about 8 parts by volume acetone or methylethylketone.

3. The system of claim 2, wherein:
   the base component comprises methylene chloride; and
   the activator component comprises (a) methylene chloride, (b) about 18 to about 22 parts by volume lower alkyl alcohol, and (c) about 4 to about 6 parts by volume acetone.

4. The system of claim 1 for removing a polyurethane coating, wherein:
   said activator component comprises (a) 85 parts by volume methylene chloride or toluene, or a mixture thereof, (b) about 7 to about 15 parts by volume lower alkyl alcohol, and (c) about 2 to about 6 parts by volume acetone or methylethylketone.

5. The system of claim 4, wherein:
   the base component comprises methylene chloride; and
   the activator component comprises (a) methylene chloride, (b) about 9 to about 13 parts by volume lower alkyl alcohol, and (c) about 3 to about 5 parts by volume acetone.

6. The system of any of claims 1 to 5, wherein said base component further comprises a thickener.

7. The system of claim 6, wherein the thickener comprises pectin, a cellulose thickener, or a silica thickener.

8. A method for removing a conformal coating from a printed circuit board, comprising the steps of:
   combining a base component comprising methylene chloride or toluene or a mixture thereof, and an activator component comprising (a) about 75 to about 85 parts by volume methylene chloride or toluene or a mixture thereof, (b) about 7 to about 25 parts by volume lower alkyl alcohol and (c) about 2 to about 8 parts by volume of acetone or methlyethylketone wherein said base component and said activator component are combined together in a ratio of base component to activator component of from about 1:1 to about 10:1, wherein said ratio is effective to form an active coating remover composition;
   treating the conformal coating on a printed circuit board by applying the active coating remover thereto; and
   removing the treated conformal coating.

9. The method of claim 8, wherein said composition is formed in a ratio of about 75 parts by volume base component to about 18 to 32 parts by volume activator component.

10. The method of claim 8, as applied to the removal of an epoxy coating, wherein said activator component comprises (a) 75 parts by volume methylene chloride or toluene, or a mixture thereof, (b) about 15 to about 25 parts by volume lower alkyl alcohol, and (c) about 2 to about 8 parts by volume acetone or methylethylketone.

11. The method of claim 8, as applied to the removal of a polyurethane coating, wherein said activator component comprises (a) 85 parts by volume methylene chloride or toluene, or a mixture thereof, (b) about 7 to about 15 parts by volume lower alkyl alcohol, and (c) about 2 to about 6 parts by volume acetone or methylethylketone.

12. A method for removing a conformal coating from a printed circuit board, comprising the steps of:
- obtaining a base component comprising methylene chloride or toluene or a mixture thereof, and as separate activator component, comprising (a) about 75 to about 85 parts by volume methylene chloride or toluene or a mixture thereof, (b) about 7 to about 25 parts by volume lower alkyl alcohol and (c) about 2 to about 8 parts by volume of acetone or methlyethylketone;
- selecting a ratio of base component to activator component of from about 1:1 to about 10:1, wherein the selection of the ratio is based on the thickness of the conformal coating to be removed;
- forming an active conformal coating remover composition by combining said base component and said activator component in said selected ratio;
- treating a conformal coating on a printed circuit board by applying the active coating remover thereto; and
- removing the treated conformal coating.

13. The method of any one of claims 8 to 12, which further comprises including a thickener in the active coating remover.

14. The method of claim 13, wherein said thickener comprises pectin, a cellulose thickener or a silica thickener.

15. The method of any one of claims 8 to 12, further comprising the step of exposing the treated conformal coating to an ultraviolet light source prior to removing the coating.

16. The method of any one of claims 8 to 12, further comprising the steps of:
- loosening the treated conformal coating by scrubbing it about 1 to 15 minutes after treatment; and
- removing the loosened conformal coating by rinsing with water.

17. The method of claim 12, wherein the conformal coating thickness is about 2 mils and the volume ratio of base component to activator component is about 6:1.

18. The method of claim 12, wherein the conformal coating thickness is about 4 mils and the volume ratio of base component to activator component is about 5:1.

19. The method of claim 12, wherein the conformal coating thickness is about 6 mils and the volume ratio of base component to activator component is about 4:1.

20. The method of claim 12, wherein the conformal coating thickness is about 8 mils and the volume ratio of base component to activator component is about 3:1.

21. The method of claim 12, wherein the conformal coating thickness is about 10 mils and the volume ratio of base component to activator component is about 2:1.

* * * * *